(12) United States Patent
Fan et al.

(10) Patent No.: US 6,605,524 B1
(45) Date of Patent: Aug. 12, 2003

(54) BUMPING PROCESS TO INCREASE BUMP HEIGHT AND TO CREATE A MORE ROBUST BUMP STRUCTURE

(75) Inventors: Yang-Tung Fan, Jubei (TW); Cheng-Yu Chu, Hsinchu (TW); Fu-Jier Fan, Jubei (TW); Shih-Jane Lin, Hsinchu (TW); Chiou-Shian Peng, Hsinchu (TW); Yen-Ming Chen, Hsinchu (TW); Kuo-Wei Lin, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/950,227

(22) Filed: Sep. 10, 2001

(51) Int. Cl.$^7$ ................................................ H01L 21/44
(52) U.S. Cl. ......................... 438/613; 438/612; 438/660
(58) Field of Search ............................... 438/612–613, 438/660, 666

(56) References Cited

U.S. PATENT DOCUMENTS

| | | | |
|---|---|---|---|
| 5,903,058 A | 5/1999 | Akram | 257/778 |
| 5,904,156 A | 5/1999 | Advocate, Jr. et al. | 134/2 |
| 5,914,274 A | 6/1999 | Yamaguchi et al. | 438/690 |
| 6,181,569 B1 * | 1/2001 | Chakravorty | 361/761 |
| 6,211,052 B1 | 4/2001 | Farnworth | 438/614 |
| 6,271,107 B1 * | 8/2001 | Massingill et al. | 438/597 |
| 6,458,622 B1 * | 10/2002 | Keser et al. | 438/106 |

* cited by examiner

*Primary Examiner*—Amir Zarabian
*Assistant Examiner*—Jamie L. Brophy
(74) *Attorney, Agent, or Firm*—George O. Saile; Stephen B. Ackerman (57) ABSTRACT

A new process is provided which is an extension and improvement of present processing for the creation of a solder bump. After the layers of Under Bump Metal and a layer of solder metal have been created in patterned and etched format and overlying the contact pad, following a conventional processing sequence, a layer of polyimide is deposited. The solder flow is performed using the thickness of the deposited layer of polyimide to control the height of the column underneath the reflown solder.

24 Claims, 6 Drawing Sheets

BUMPING PROCESS TO INCREASE BUMP HEIGHT AND TO CREATE A MORE ROBUST BUMP STRUCTURE

BACKGROUND OF THE INVENTION (1) Field of the Invention

The invention relates to the fabrication of integrated circuit devices, and more particularly, to a method of creating interconnect bumps of improved height and reliability.

(2) Description of the Prior Art

In the art of creating semiconductor devices, many mutually supporting technologies are used. While a considerable amount of attention is typically dedicated to the creation of the semiconductor device per se, these devices after their creation must be further connected to surrounding circuitry or to other semiconductor devices. For the connections that must be made to the semiconductor device itself, various techniques have been developed and are in current use. In order to be able to electrically interface with the die, points of interconnect must be provided on a surface of the die. This has led to a number of divergent approaches such as the creation of Ball Grid Array (BGA) devices, Land Grid Array (LGA) and Pin Grid Array (PGA) devices, Chip Scale Packaging (CSP) and Quad Flat Pack (QFP) devices. One of the salient developments is the creation of the flip chip which has a pattern or array of interconnect points spaced over the active surface of the die, the flip chip is mounted face-down to the surface of a substrate. The methods that are used to create the points of electrical interconnect on the surface of the flip essentially follows one of two approaches, that is the method whereby a solder bump is created and the method whereby a contact ball is created. Both methods start from a pad electrode that provides direct electrical interface with a the die. In the method whereby a solder bump is created, a barrier layer is typically first blankly deposited over the surface of the wafer that contains the flip chip, the barrier layer typically comprising titanium or nickel or chromium, deposited using vacuum deposition methods or metal sputtering. After the barrier layer has been deposited, solder layers are selectively formed over the pad electrodes by methods of vacuum deposition or electrolytic plating or solder ball formation. For the method whereby a contact ball is created, ball bonding is performed over the surface of the pad electrodes by wire-bonding a (typically gold) wire to the pad electrode thus forming the contact ball.

In the formation of points of electrical contact on the surface of a semiconductor die, normal considerations of cost and reliability continue to play an important role. This places the method of forming solder bumps, the first of the two highlighted methods, at a disadvantage since this method requires the application of a barrier layer. Solder bump reliability further requires that the solder bump is of a reasonable sturdy construction, implying that the solder ball must have an adequate height from which follows that the vacuum deposition of the layer of solder (over the barrier layer) can become too time-consuming, further increasing the cost of using the solder bump method. The method of electrolytic plating that has been indicated above as being applicable for the formation of solder bumps does not lend itself to adequate control over the dimensional parameters of the solder bumps that are created. This is caused by the nature of the solder deposition of this method, whereby the deposition of the solder is heavily dependent on the energy (electric field distribution) that is applied for the formation of each solder bump while, since the solder bumps must be uniformly and simultaneously created for a large number of points of electrical contact, a common electrode is required to interconnect all contact pads over which solder bumps are to be created.

The ball bonding method has the disadvantage that each contact pad must be provided with a contact ball, placing a severe limitation on device throughput, making this method not suitable for high speed throughput and therefore for modern, cost effective production methods. In addition, since the method of contact ball formation depends on thermal treatment of interfacing surfaces, this method leads to poor reliability performance of the device and frequently leads to more sophisticated methods of contact ball creation which again add cost to the process.

The invention addresses these and other concerns by addressing issues of providing a solder bump of adequate height, the issue of missing solder bumps and the issue of the solder bump processing time or window.

U.S. Pat. No. 6,211,052 (Farnworth) shows a UBM and bump process using photoresist.

U.S. Pat. No. 5,904,156 (Advocate) shows a process for a dry film resist removal in the presence of electroplated bumps.

U.S. Pat. No. 5,914,274 (Yamaguchi) shows a substrate on which bumps are formed and a method of forming same.

U.S. Pat. No. 5,903,058 (Akram) shows a process for conductive bumps on a die.

SUMMARY OF THE INVENTION

A principle objective of the invention is to provide a method for the creation of a solder bump that provides a solder bump of increased height.

Another objective of the invention is to provide a method for the creation of a solder bump that provides a solder bump of improved robustness.

Another objective of the invention is to provide a method for the creation of a solder bump that provides a solder bump of different height by adjusting the thickness of a layer of polyimide that is used in the process of solder bump creation, this without the need for modification of the layer of Under Bump Metal.

A still further objective of the invention is to provide a method of creating solder bumps that eliminates missing solder bumps.

A still further objective of the invention is to provide a method of creating solder bumps that extends the processing window that is required for the creation of the solder bump.

A still further objective of the invention is to provide a method of creating solder bumps that extends the processing window that is required for the packaging of a semiconductor die and that further improves package yield.

In accordance with the objectives of the invention a new process is provided which is an extension and improvement of present processing for the creation of a solder bump. After the layers of Under Bump Metal and a layer of solder metal have been created in patterned and etched format and overlying the contact pad, following a conventional processing sequence, a layer of polyimide is deposited. The solder flow is performed using the thickness of the deposited layer of polyimide to control the height of the column underneath the reflow solder.

BRIEF DESCRIPTION OF THE DRAWINGS

FIGS. 1 through 7 address prior art methods of forming a solder ball, as follows:

FIGS. 8 through 14 address the invention, as follows:

DESCRIPTION OF THE PREFERRED EMBODIMENTS

Conventional methods of forming a solder bump will first be highlighted in order to facilitate comparison with the invention.

Figure 1:
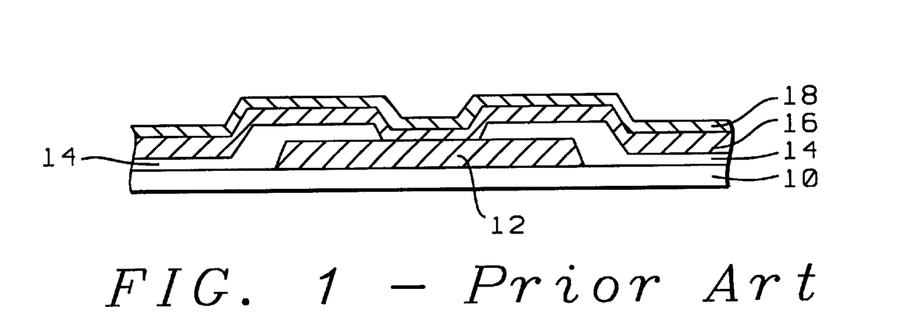
FIG. 1 shows a cross section of a semiconductor surface on which a contact pad has been provided, a layer of passivation has been deposited over the semiconductor surface and has been patterned and etched, exposing the surface of the aluminum pad. A seed layer has been blanket deposited, a film of Under Ball Metallurgy has been blanket deposited over the seed layer.

Referring now specifically to FIG. 1, there is shown a cross section of a semiconductor surface 10 on which:

- a contact pad 12 has been provided; contact pad 12 preferably comprises aluminum or an aluminum alloy or copper
- a layer 14 of passivation has been deposited over the semiconductor surface 10 and has been patterned and etched partially exposing the surface of the aluminum pad 12
- in-situ sputter clean has been performed of the exposed surface of the contact pad
- a seed layer 16 has been blanket deposited over the surface of the layer 14 of passivation including the exposed surface of the contact pad 12, and
- a film 18 of Under Ball Metallurgy has been blanket deposited over the seed layer.

Layer 10 is the surface of a semiconductor layer, a contact pad 12 has been created on surface 10. Surface 10 will typically be the surface of a semiconductor substrate, the surface of an interconnect substrate and the like. A contact pad 12 has been created on surface 10, electrical contact must be established with contact pad 12 by means of an overlying solder bump. Contact pad 12 serves as an interface between the solder bump and electrical interconnects that are provided in the surface of layer 10.

A layer 14 of passivation that may, for instance, contain Plasma Enhanced silicon nitride (PE $Si_3N_4$), is deposited over the surface of layer 10 and of contact pad 12.

Insulating/passivation layers such as silicon oxide and oxygen-containing polymers are deposited over the surface of various layers of conducting lines in a semiconductor device or substrate to separate the conductive interconnect lines from each other, the insulating layers can be deposited using Chemical Vapor Deposition (CVD) techniques. The insulating layers are deposited over patterned layers of interconnecting lines where electrical contact between successive layers of interconnecting lines is established with metal vias created for this purpose in the insulating layers. Electrical contact to the chip is typically established by means of bonding pads or contact pads that form electrical interfaces with patterned levels of interconnecting metal lines. Signal lines and power/ground lines can be connected to the bonding pads or contact pads. After the bonding pads or contact pads have been created on the surfaces of the chip package, the bonding pads or contact pads are passivated and electrically insulated by the deposition of a passivation layer over the surface of the bonding pads. A passivation layer can contain silicon oxide/silicon nitride ($SiO_2/Si_3N_4$) deposited by CVD. The passivation layer is patterned and etched to create openings in the passivation layer for the bonding pads or contact pads after which a second and relatively thick passivation layer can be deposited for further insulation and protection of the surface of the chips from moisture and other contaminants and from mechanical damage during assembling of the chips.

Various materials have found application in the creation of passivation layers. Passivation layer can contain silicon oxide/silicon nitride ($SiO_2/Si_3N_4$) deposited by CVD, a passivation layer can be a layer of photosensitive polyimide or can comprise titanium nitride. Another material often used for a passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure, which have been highlighted above. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross-linked, thereby leaving unexposed regions (that are not cross-linked) over the bonding pads. During subsequent development, the unexposed polyimide precursor layer (over the bonding pads) is dissolved, thereby providing openings over the bonding pads. A final step of thermal curing leaves a permanent high quality passivation layer of polyimide over the substrate.

The preferred material of the invention for the deposition of layer 14 of passivation is Plasma Enhanced silicon nitride (PE $Si_3N_4$), deposited using PECVD technology at a temperature between about 350 and 450 degrees C. with a pressure of between about 2.0 and 2.8 Torr for the duration between about 8 and 12 seconds. Layer 14 of PE $Si_3N_4$ can be deposited to a thickness between about 12 and 15 μm.

Layer 14 of PE $Si_3N_4$ is next patterned and etched to create an opening in the layer 14 that overlays and aligns with the underlying contact pad 12.

The etching of layer 14 can use $Ar/CF_4$ as an etchant at a temperature of between about 120 and 160 degrees C. and a pressure of between about 0.30 and 0.40 Torr for a time of between about 33 and 39 seconds using a dry etch process.

The etching of layer 14 can also use $He/NF_3$ as an etchant at a temperature of between about 80 and 100 degrees C. and a pressure of between about 1.20 and 1.30 Torr for a time of between about 20 and 30 seconds using a dry etch process.

For the in-situ sputter clean, a sputter ion-milling tool can be used using Ar mixed with $H_2$ as a cleaning agent (sputter source).

For the seed layer 16 that is blanket deposited over the surface of the layer 14 of passivation, including the exposed surface of the contact pad 12, any of the conventional metallic seed materials can be used. The metallic seed layer can be deposited using a sputter chamber or an Ion Metal Plasma (IMP) chamber at a temperature of between about 0 and 300 degrees C. and a pressure of between about 1 and 100 mTorr, using (for instance) copper or a copper alloy as the source (as highlighted above) at a flow rate of between about 10 and 400 sccm and using argon as an ambient gas.

Layer 18 of UBM, typically of nickel and of a thickness between about 1 and 10 $\mu$m, has been deposited by vacuum evaporation or by electroplating, this layer is as yet to be patterned and etched. Layer 18 may contain multiple layers of metal such as layers of chrome, followed by a layer of copper, followed by a layer of gold.

Figure 2:
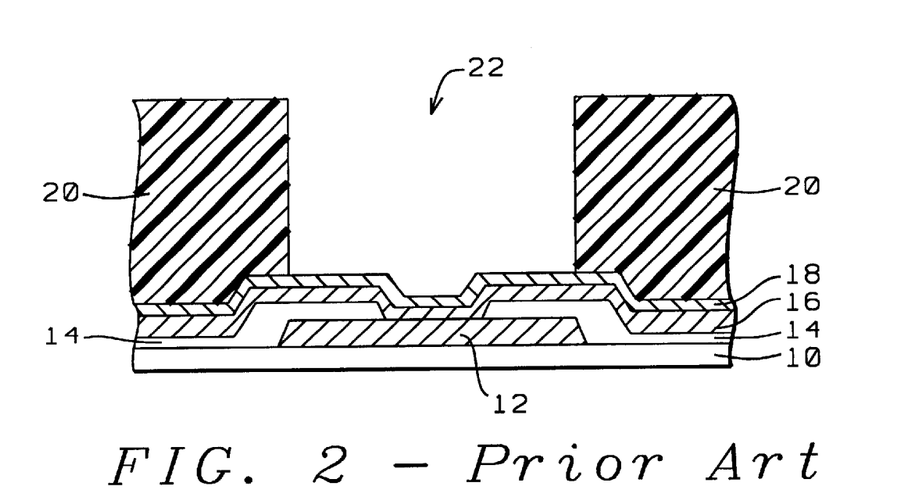
FIG. 2 shows the cross section of FIG. 1 after a photoresist mask has been created.

FIG. 2 shows the cross section of the semiconductor surface 10 after a layer 20 of photoresist has been deposited over the layer 18 of UBM. Layer 20 of photoresist has been patterned and developed, creating opening 22 in the layer 20 of photoresist, partially exposing the surface of the layer 18 of UBM overlying the contact pad 12 where the interconnect bump is to be formed.

Layer 20 of photoresist can be deposited or laminated to a thickness of between about 2,000 and 8,000 Angstrom or between about 50 and 120 $\mu$m. The methods used for the deposition or lamination and development of the layer 20 of photoresist apply conventional methods of photolithography. Photolithography is a common approach wherein patterned layers are usually formed by spinning or by laminating on a layer of photoresist, projecting light through a photomask with the desired pattern onto the photoresist to expose the photoresist to the pattern, developing the photoresist, washing off the unexposed photoresist, and plasma etching to clean out the areas where the photoresist has been washed away. The exposed resist may be rendered insoluble (negative working) and form the pattern, or soluble (positive working) and be washed away.

The layer 20 of photoresist will, after patterning and developing, remain in place in an area above the aluminum pad 12 that surrounds the pad 12 and that is adjacent to the pad 12. The deposited layer 18 of photoresist can, prior to patterning and etching, be cured or pre-baked further hardening the surface of the layer of photoresist.

Layer 20 of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 20 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Layer 20 of photoresist can additionally be cured after the layer of photoresist has been deposited and before the layer of photoresist is patterned and developed. This curing of the layer of photoresist can be performed in a N2 gas ambient, at a temperature of between about 300 and 400 degrees C., for a time period between about 1.5 and 2.5 hours, and a pressure of 760 Torr.

Figure 3:
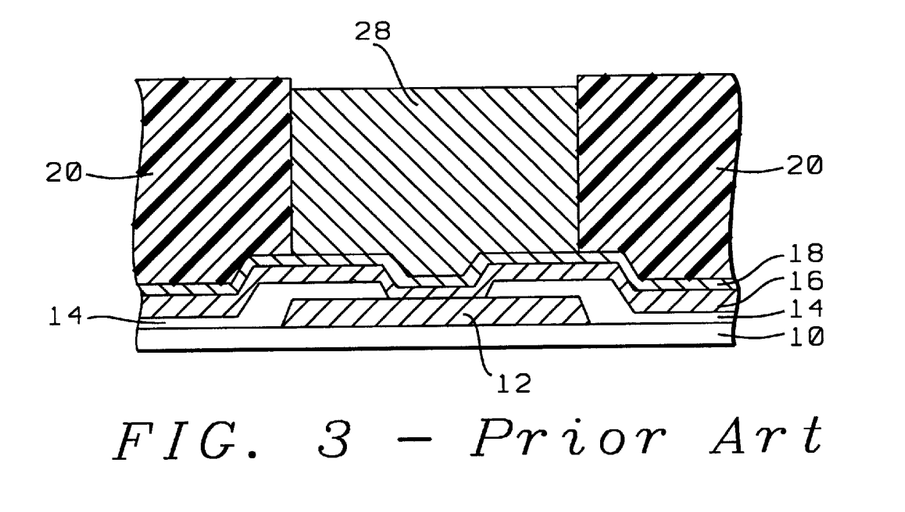
FIG. 3 shows the cross section of FIG. 3 after the exposed surface of UBM has been electro plated with a layer of solder.

FIG. 3 shows a cross section of the semiconductor surface 10 after the exposed surface of layer 18 of UBM, that is surface of layer 18 of UBM that is exposed inside opening 22, has been electro plated with layer 28 of solder. Layer 28 is bounded by the patterned layer 20 of photoresist. During the process of the electroplating, the layer 18 of UBM serves as the cathode of the plating tool.

Additionally and as a pre-cursor to the processing step of depositing solder alloy 28 over the surface of the layer of UBM, additional layers of metal may be electroplated over the exposed surface of the layer 18 of UBM. These layers are not shown in the cross section of FIG. 3, the additional layers can for instance comprise copper or nickel.

The layer 28 of bump metal (typically solder) is electroplated in contact with the layers 18, to a thickness of between about 30 and 100 $\mu$m but more preferably to a thickness of about 50 $\mu$m.

Figure 4:
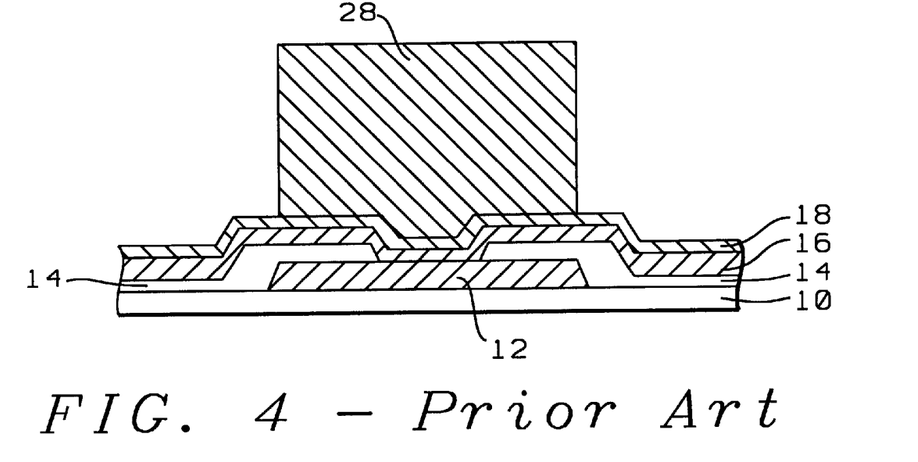
FIG. 4 shows a cross section after the photoresist mask has been removed.

FIG. 4 shows the cross section of the semiconductor surface after the patterned layer 20 of photoresist has been stripped from the surface of the layer 18 of UBM. The previously highlighted processing conditions for the removal of photoresist can be equally applied to the stripping of the photoresist that is shown in FIG. 4, these conditions therefore do not need to be further highlighted at this time.

Figure 5:
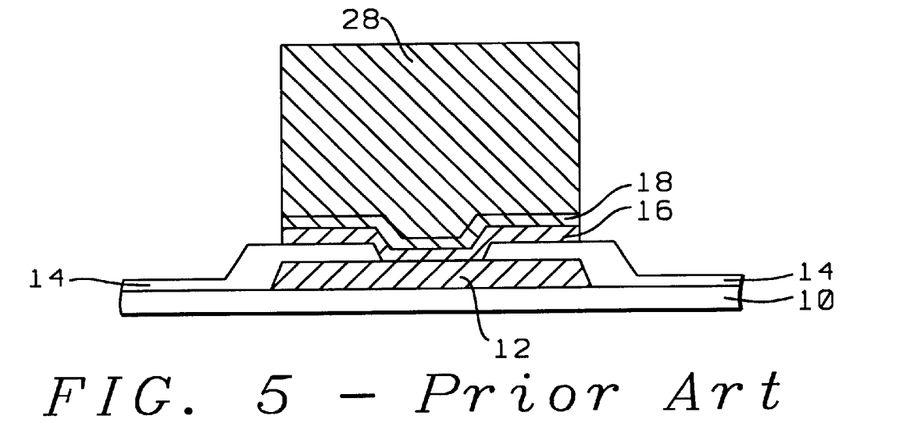
FIG. 5 shows a cross section after the layers of UBM and the seed layer have been etched.

FIG. 5 shows a cross section of the semiconductor surface 10 after the layers 18 (of UBM) and 16 (of seed material) have been etched using the created layer 28 of solder as a mask. Standard RIE procedures, using $Cl_2$-$BCl_3$ as etchant, can be used to etch the layers 18 and 16 of UBM and seed material.

Figure 6:
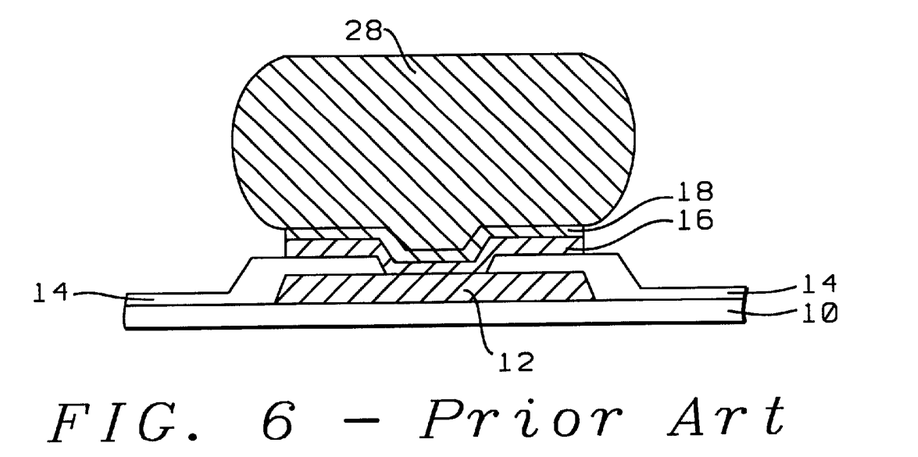
FIG. 6 shows a cross section after reflow of the solder material.

As a final figure of the highlighted prior art processing sequence FIG. 6 shows the creation of solder ball 28 after the patterned layer 28 of solder that is shown in cross section in FIG. 5 has been submitted to reflow by applying heat to the structure. For this processing step, a flux is applied to the solder layer 28 and the solder is melted in a reflow surface under a nitrogen atmosphere, forming the spherically shaped solder bump 28 that is shown in cross section in FIG. 6.

Figure 7:
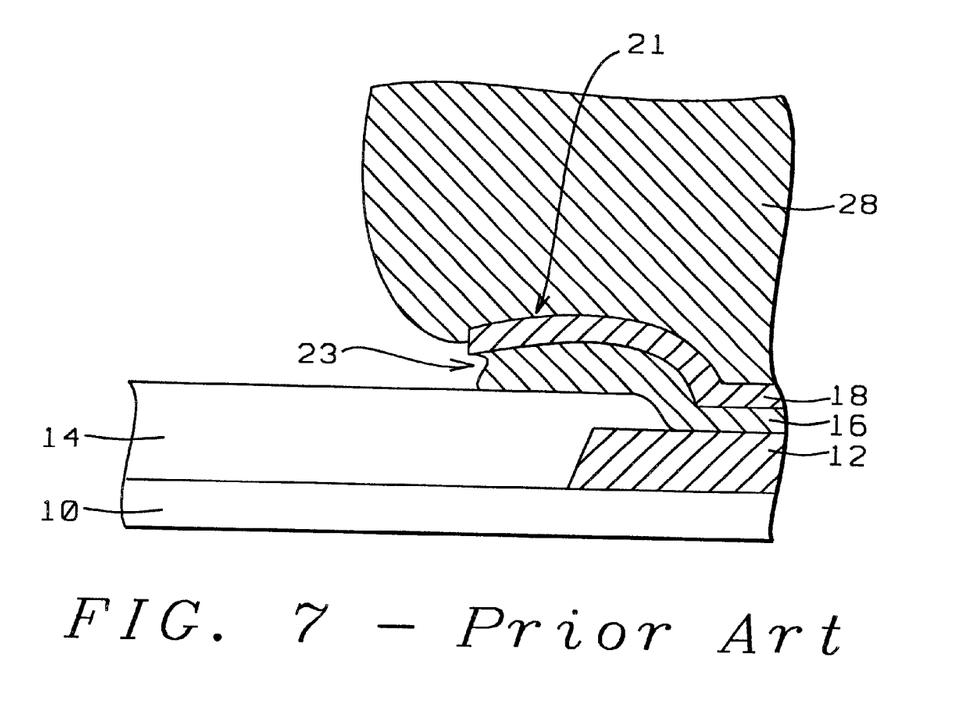
FIG. 7 highlights problems encountered with current methods of forming a solder ball.

An essential weakness of the processing steps that have been described using FIGS. 1 through 6 is demonstrated in the cross section that is shown in FIG. 7. Layer 16, of seed material and layer 18 of UBM are shown. Where FIG. 6 shows a cross section in which layers 16 and 18 have, around the perimeter of these layers, a surface that is essentially flat, a cross section taken of the structure that has been created following the processing steps of FIGS. 1 through 6 has a profile shown in FIG. 7. From this cross section it is clear that the desired planarity if layers 16 and 18 in the perimeter of these layers is not the present but that both layers show a significant amount of upward bulging 21. This upward sloping profile 21 of layers 16 and 18 results in an undercut 23 where layer 16 is not fully present underneath layer 18. The end result of the indicated non-planarity 21 and the undercut 23 is that the profile of solder bump 28 does not have (the desired) spherical shape leading to significant problems of interconnect and interconnect reliability of the solder bump 28.

In addition, for closely spaced solder bumps (which are increasingly required in view of the continuing increase in device density) the solder bump 28 is likely to sag sideways as a result of undercut 23. This sideways motion of the solder bump 28 additionally brings the surface of the solder ball which is closest to an adjacent solder ball even closer to the adjacent solder ball, making actual contact between adjacent solder balls a very real possibility.

Keeping the preceding drawings and the processing steps that have been described using these drawings in mind, the invention will now be described. A number of the processing steps of the invention are identical to the prior art processing steps that have been described above.

For purposes of completeness, drawings that apply to both prior art processing and the invention will be repeated at this time. Repetition in the text will be avoided by limiting related text for drawings that have previously been described.

Figure 8:
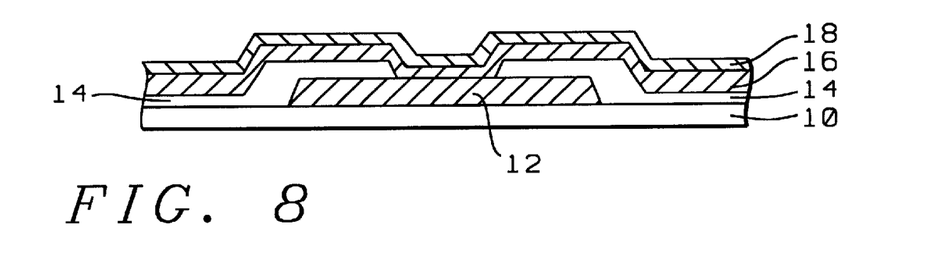
FIGS. 8 through 12 are identical with FIGS. 1 through 5 and have been included to show a complete processing cycle of the invention.

FIG. 8 is identical to FIG. 1, in sum:

a contact pad 12 has been provided a layer 14 of passivation has been deposited over the semiconductor 10 and has been patterned, exposing the aluminum pad 12 in-situ sputter clean has been performed of the contact pad 12 a seed layer 16 has been deposited over the layer 14 of passivation, including the contact pad 12, and a film 18 of Under Ball Metallurgy has been deposited over the seed layer 16.

Figure 9:
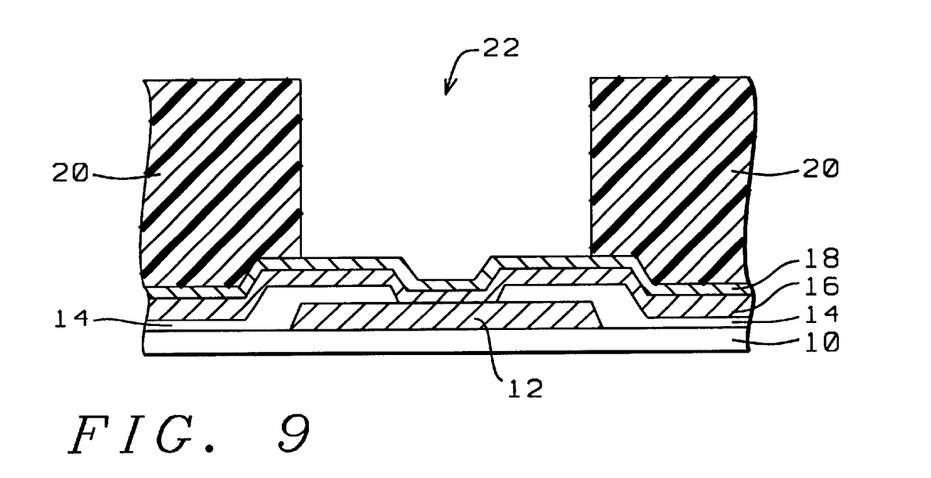

FIG. 9 is identical with FIG. 2, a layer 20 of photoresist has been deposited over the layer 18 of UBM. Layer 20 of photoresist has been patterned and developed, creating opening 22 in the layer 20 of photoresist, partially exposing the surface of the layer 18 of UBM overlying the contact pad 12 where the interconnect bump is to be formed.

Figure 10:
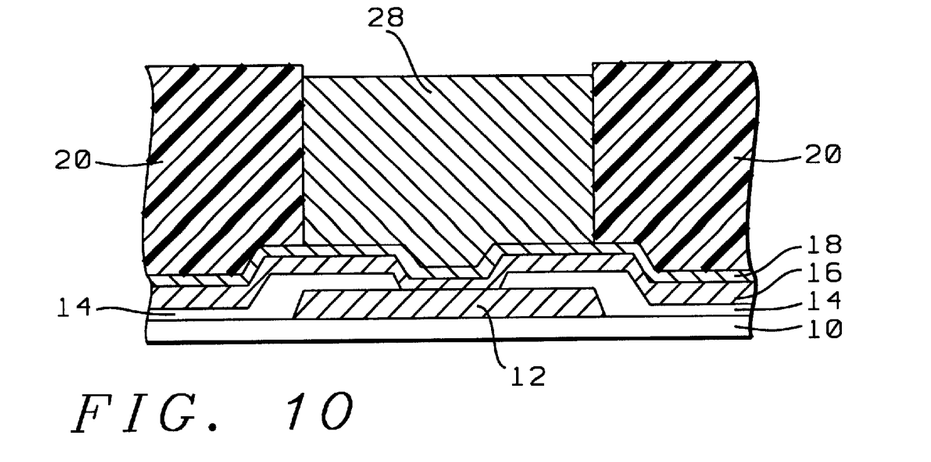

FIG. 10 is identical with FIG. 3, the exposed surface of layer 18 of UBM has been electro plated with a layer 28 of solder.

Figure 11:
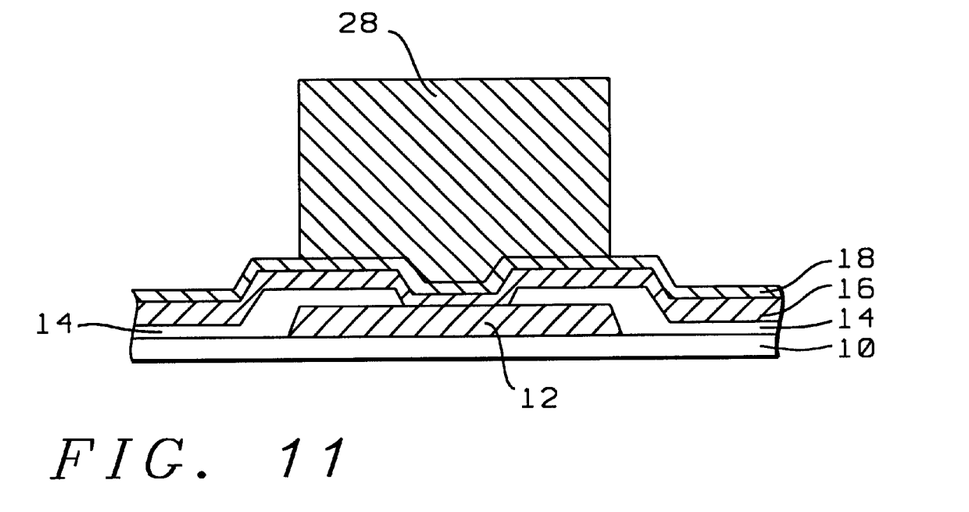

FIG. 11 is identical with FIG. 4, the patterned layer 20 of photoresist has been stripped from the surface of the layer 18 of UBM.

Figure 12:
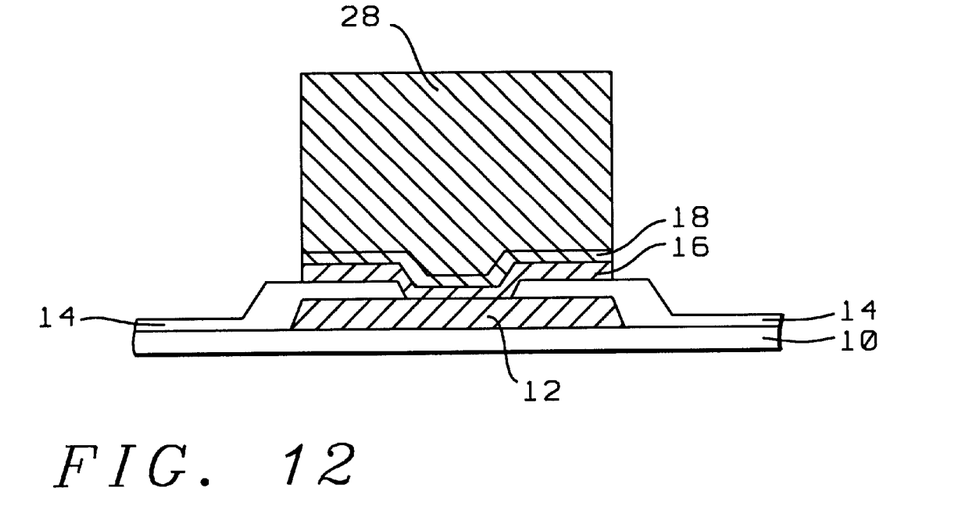

FIG. 12 is identical with FIG. 5, the layers 18 (of UBM) and 16 (of seed material) have been etched using the created layer 28 of solder as a mask.

Figure 13:
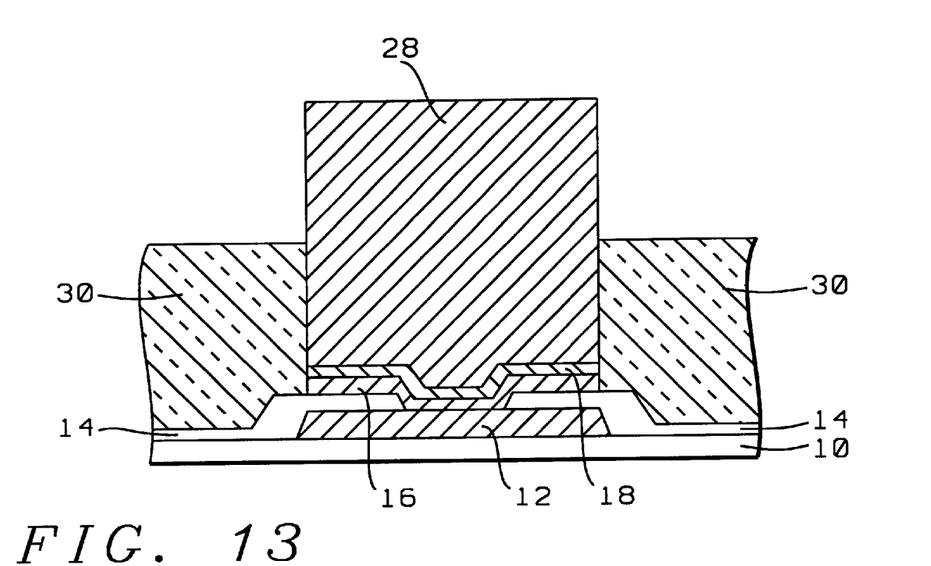
FIG. 13 shows a cross section after a layer of polyimide has been deposited over the structure that is shown in cross section in FIG. 12.

FIG. 13 shows the novel processing step of the invention. A layer 30 of polyimide has been coated over the surface of the structure of FIG. 12.

The use of polyimide films as intra and inter-level dielectrics provides a number of advantages for such applications. For instance, polyimides produce surfaces in which the step heights of underlying features are reduced and step slopes are gentle and smooth. Cured polyimide films can tolerate temperatures of up to 500 degrees C. without degradation of their dielectric film characteristics. Polyimide films have dielectric breakdowns that are only slightly lower than the dielectric breakdowns of $SiO_2$ while the dielectric constant of polyimides is smaller than the dielectric constant of silicon nitride and of $SiO_2$. Finally, the processes of depositing polyimide and of pattern polyimide films are relatively simple.

Polyimide processing is a well understood semiconductor art and is designed to give extra protection to the surface of the silicon chip against scratching, cracking and other types of mechanical damage. Polyimide is typically applied over the surface of the entire substrate. Most often, mechanical damage occurs during assembly, packaging or any subsequent handling of the die. As a passivation layer, polyimide also guards against thin film cracking which frequently results from the packaging of very large dies into plastic packages.

Existing polyimide processes are compatible with standard forms of wire bonding technology. Polyimide is typically spun on in the form of a liquid (polyamic-acid precursor). Normal defects, such as cracks or flakes, which arise from the interaction of the polyimide with photoresist, do not normally pose a problem for this standard bonding technology.

For many applications, the remaining (after develop) polyimide is cured and cross-linked in order to protect the device circuitry. This step is a high temperature cure, which evaporates the solvents in the polyimide, typically at 350 degrees C. for 120 minutes. Etching of the cured film often uses oxygen or fluorine based plasma.

above referenced material that is used for the deposition of layer 30 is polyimide, the material that can be used for this layer is not limited to polyimide but can contain any of the known polymers ($SiCl_xO_y$). The indicated polyimide is the preferred material to be used for the processes of the invention for the thick layer 30 of polymer. Examples of polymers that can be used are silicons, carbons, fluoride, chlorides, oxygens, parylene or teflon, polycarbonate (PC), polysterene (PS), polyoxide (PO), poly polooxide (PPO), benzocyclobutene (BCB).

For the deposition of layer 30 the Hitachi-Dupont polyimide RHD 2732 or 2734 or Ashahi polyimide can, for example, be used. The polyimide can be spin-on coated and cured. After spin-on coating, the polyimide will be cured at 400 degrees C. for 1 hour in a vacuum or nitrogen ambient. For thicker polyimide, the polyimide film can be multiple coated and cured. This step of coating of the polyimide can also be performed at room temperature and ambient pressure for a time of between about 30 and 40 seconds. The indicated processing parameters are not critical since the polyimide thickness is controlled by spin speed.

It is clear from the above and from the cross section that is shown in FIG. 13, that the thickness of the layer 30 of polyimide can be controlled and selected to be a desirably value, this especially in relation to the height of the column 28 of solder material. This implies that the height over which the solder column 28 protrudes above the surface of the layer 30 can be controlled from which follows that the diameter of the solder ball that is created by reflowing the solder column 28 can be controlled. Most importantly is the observation that the layer 30 of polyimide provides adequate thermal protection to underlying layers 16 and 18, resulting in a final profile of these layers that does not show bulging (21, FIG. 7) and an under-cut (23, FIG. 7), which may occur using conventional methods of creating a solder bump as shown in FIG. 7.

Figure 14:
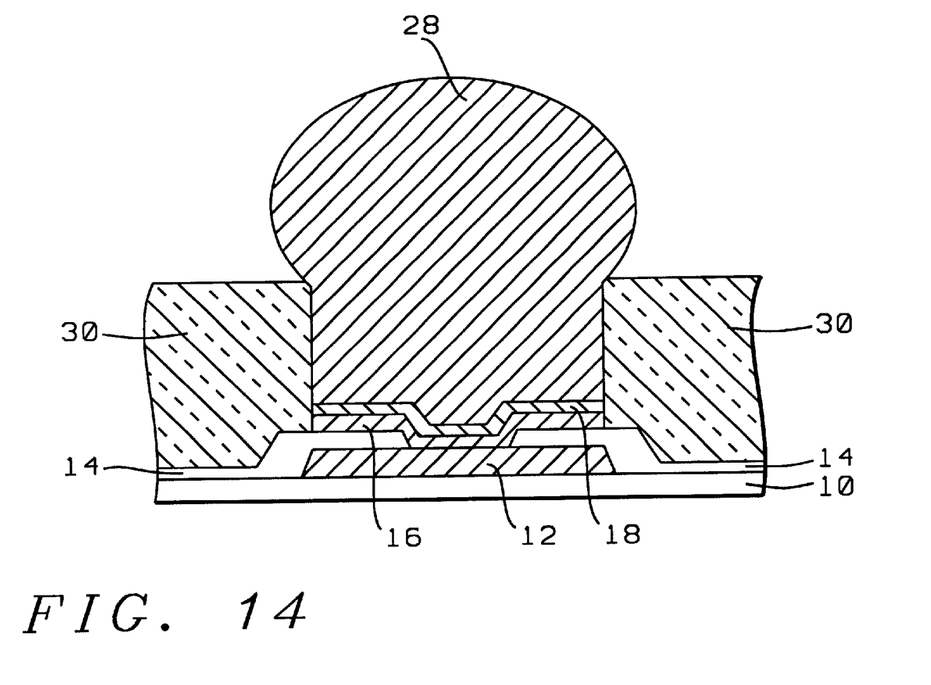
FIG. 14 shows a cross section after reflow of the deposited solder material.

Remains for the column of solder material that protrudes above the layer 30 of polyimide to be shaped into a solder ball by exposing the structure to heat. For this processing step, a flux is applied to the solder layer 28 and the solder is melted in a reflow surface under a nitrogen atmosphere, forming the spherically shaped solder bump 28 that is shown in cross section in FIG. 14.

The layer 30 of polyimide remains in place as part of the completed device, thus realizing the previously cited advantages that are provided by the use of polyimide as an intra-level of dielectric.

The comparison between conventional methods of creating a solder bump and the method of the invention can best be highlighted by briefly reviewing the processing sequence of both methods, as follows:

Conventional process flow:
provide a semiconductor substrate on the surface of which has been provided a contact pad, exposed through an opening in a layer of passivation
deposit/sputter a layer of seed material
sputter/plating a layer of UBM
coat a layer of photoresist
pattern and develop the layer of photoresist, creating an opening in the layer of photoresist that aligns with the exposed surface of the contact pad
solder plate a layer inside the opening created in the layer of photoresist
remove the developed layer of photoresist
etch the layer of UBM and the layer of seed material, using the solder plated solder as a mask
reflow the solder.

The process flow of the invention is, showing the new processing steps of the invention between asterisks:
provide a semiconductor substrate on the surface of which has been provided a contact pad, exposed through an opening in a layer of passivation
deposit/sputter a layer of seed material
sputter/plating a layer of UBM
coat a layer of photoresist
pattern and develop the layer of photoresist, creating an opening in the layer of photoresist that aligns with the exposed surface of the contact pad
solder plate a layer inside the opening created in the layer of photoresist
remove the developed layer of photoresist
etch the layer of UBM and the layer of seed material, using the solder plated solder as a mask
* coat a layer of polyimide to a thickness *
* optionally, reduce the thickness of the coated layer of polyimide by etching the layer of polyimide *
reflow the solder.

It is clear from the invention that the thickness of the layer of polyimide, which serves as a control agent during the reflow of the layer of solder, can be selected such that the height of the solder bump can be selected. The solder that is surrounded by the layer of polyimide will not reflow, the solder that is exposed from the surface of the layer of polyimide will reflow.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the creation of a solder bump, comprising the steps of:
   providing a semiconductor substrate, at least one contact pad having been provided over said substrate, a layer of passivation having been deposited over said substrate, said layer of passivation having at least one opening through said layer of passivation that aligns with said at least one contact pad;
   creating a layer of Under Bump Metal (UBM) over said at least one contact pad;
   electroplating a solder layer over said layer of UBM to a solder height, said solder layer having a surface;
   after electroplating the solder layer, coating a layer of polyimide over the layer of passivation, and surrounding the solder layer to a polyimide thickness;
   assuring that said solder height exceeds said polyimide thickness, thereby assuring that said solder layer protrudes from said layer of Polyimide;
   with the layer of polyimide surrounding the solder layer reflowing said protruding layer of solder, thereby creating a solder ball.

2. The method of claim 1, said at least one contact pad comprising aluminum or an aluminum alloy or copper.

3. The method of claim 1, said creating a layer of Under Bump Metal (UBM) comprising creating a layer of nickel, created to a thickness between about 1 and 10 $\mu$m, deposited by vacuum evaporation or by electroplating.

4. The method of claim 1, said creating a layer of Under Bump Metal (UBM) comprising creating a layer of chrome, followed by a layer of cooper, followed by a layer of gold, created to a thickness between about 1 and 10 $\mu$m, deposited by vacuum evaporation or by electroplating.

5. The method of claim 1, said creating a layer of Under Bump Metal (UBM) comprising creating multiple layers of metal.

6. The method of claim 1, said assuring that said solder height exceeds said polyimide thickness comprises etching said layer of polyimide, thereby reducing said polyimide thickness such that said surface of said electroplated solder is in a plane that is further removed from the surface of said substrate than the surface of said layer of polyimide.

7. The method of claim 1, said reflowing said protruding layer of solder comprising:
   applying a flux to exposed surfaces of said layer of solder; and
   exposing the solder layer in a reflow surface to elevated temperatures under a nitrogen atmosphere, forming a spherically shaped solder bump above a plane of the surface of said layer of polyimide.

8. The method of claim 1, with additional steps of creating at least one layer of metal by electroplating said layer of UBM said additional steps being performed prior to, said step of electroplating a solder layer over said layer of UBM to the solder height.

9. The method of claim 1, with an additional step of performing an in-situ sputter clean of said at least one contact pad.

10. A method for the creation of a solder bump, comprising the steps of:
    providing a semiconductor substrate, at least one contact pad having been provided over said substrate, a layer of passivation having been deposited over said substrate, said layer of passivation having been patterned creating at least one opening through said layer of passivation that aligns with said at least one contact pad;

depositing a layer of seed material over said layer of passivation, including the at least one contact pad;

creating a layer of Under Bump Metal (UBM) over said layer of seed material;

creating a photoresist mask over said layer of UBM, said photoresist mask having at least one opening that aligns with said at least one contact pad;

electroplating said layer of UBM in accordance with said photoresist mask using solder as a source, filling said at least one opening created in said photoresist mask with solder to a solder height, said solder having a surface;

removing said photoresist mask from said layer of UBM;

etching said layer of UBM, using said electroplated solder as a mask;

etching said layer of seed material, using said electroplated solder as a mask;

after electroplating said solder, coating a layer of polyimide over the layer of passivation, and surrounding the solder to a polyimide thickness, said polyimide thickness being less than said solder height; and with the layer of polyimide surrounding the solder reflowing said solder, thereby creating a solder ball.

11. The method of claim 10, said at least one contact pad comprising aluminum or an aluminum alloy.

12. The method of claim 10, said creating a layer of Under Bump Metal (UBM) over said layer of seed material comprising creating a layer of nickel, created to a thickness between about 1 and 10 $\mu$m, deposited by vacuum evaporation or by electroplating.

13. The method of claim 10, said creating a layer of Under Bump Metal (UBM) over said layer of seed material comprising creating a layer of chrome, followed by a layer of copper, followed by a layer of gold, created to a thickness between about 1 and 10 $\mu$m, deposited by vacuum evaporation or by electroplating.

14. The method of claim 10, said creating a layer of Under Bump Metal (UBM) over said layer of seed material comprising creating multiple layers of metal.

15. The method of claim 10, with an additional step of etching said layer of polyimide, thereby reducing said polyimide thickness, and increasing a measurable amount that said solder protrudes from said layer of polyimide, said measurable amount being determined by design requirements of solder bump size and pitch, said additional step being performed prior to said step of reflowing said solder.

16. The method of claim 10, said reflowing said solder comprising:

applying a flux to said solder; and exposing the solder in a reflow surface to elevated temperatures under a nitrogen atmosphere, forming a spherically shaped solder bump above the surface of said layer of polyimide.

17. The method of claim 10, with additional steps of creating at least one layer of metal by electroplating said layer of UBM in accordance with said photoresist mask, said additional steps to be performed prior to said step of electroplating using solder as a source.

18. The method of claim 10, with an additional step of performing an in-situ sputter clean of said at least one contact pad, said additional step being performed prior to said step of depositing a layer of seed material over said layer of passivation.

19. A method for forming a bump on a semiconductor substrate, at least one contact pad having-been provided over said semiconductor substrate, comprising the steps of:

depositing a layer of passivation over said semiconductor substrate, including said at least one contact pad;

patterning said layer of passivation, creating at least one opening in said layer of passivation;

performing an in-situ sputter clean of said at least one contact pad;

depositing a layer of seed material over said layer of passivation, including said at least one contact pad;

plating a layer of Under Bump Metallurgy (UBM) over said layer of seed material;

creating a photoresist mask over said layer of UBM, a pattern of at least one opening of said photoresist mask being aligned with said at least one contact pad provided over said substrate;

electroplating said layer of UBM using solder as a source, forming a pattern of at least one layer of solder aligned with said at least one contact pad, said at least one layer of solder having a surface, said at least one layer of solder having a solder height;

removing said photoresist mask from said layer of UBM;

etching said layer of UBM and said layer of seed material using said pattern of said at least one layer of solder as a mask;

after electroplating said at least one layer of solder coating a layer of polyimide over said layer of passivation to a thickness such that the surface of said at least one layer of solder is in a plane above the surface of said coated layer of polyimide;

applying a solder flux or paste to the surface of said at least one layer of solder; and with the layer of polyimide surrounding the at least one layer of solder reflowing said at least one layer of solder.

20. The method of claim 19 with an additional step of curing a photoresist, said additional step to be performed after said photoresist has been deposited and before said photoresist is patterned and developed for the creation of said photoresist mask.

21. The method of claim 20 wherein said curing layer of photoresist is performed in a $N_2$ gas ambient, at a temperature of between about 300 and 400 degrees C., for a time period between about 1.5 and 2.5 hours, and a pressure of 760 Torr.

22. The method of claim 19, said layer of Under Bump Metallurgy comprising a plurality of sub-layers of different metallic composition.

23. The method of claim 19, said at least one contact pad comprising aluminum or an aluminum alloy.

24. The method of claim 19, said plating a layer of Under Bump Metallurgy (UBM) over said layer of seed material comprises creating a layer of chrome, followed by a layer of copper, followed by a layer of gold, created to a thickness between about 1 and 10 $\mu$m, deposited by vacuum evaporation or by electroplating.

* * * * *